(12) United States Patent
Edelman et al.

(10) Patent No.: US 8,274,284 B2
(45) Date of Patent: Sep. 25, 2012

(54) PARALLEL-ACCELERATED COMPLEX SUBTRACTION MRI

(75) Inventors: Robert R. Edelman, Highland Park, IL (US); Ioannia Koktzoglou, Rolling Meadows, IL (US)

(73) Assignee: NorthShore University HealthSystem, Evanston, IL (US)

( * ) Notice: Subject to any disclaimer, the term of this patent is extended or adjusted under 35 U.S.C. 154(b) by 383 days.

(21) Appl. No.: 12/574,497

(22) Filed: Oct. 6, 2009

(65) Prior Publication Data

US 2011/0080166 A1 Apr. 7, 2011

(51) Int. Cl.
*G01V 3/00* (2006.01)
(52) U.S. Cl. ........................................................ 324/309
(58) Field of Classification Search .......... 324/300–322; 600/410–435; 382/100–154
See application file for complete search history.

(56) References Cited

U.S. PATENT DOCUMENTS

| | | | | |
|---|---|---|---|---|
| 6,487,435 B2* | 11/2002 | Mistretta et al. | ............. | 600/420 |
| 6,630,828 B1* | 10/2003 | Mistretta et al. | ............. | 324/309 |
| 6,850,061 B2* | 2/2005 | Stoyle | ............. | 324/306 |
| 6,954,067 B2* | 10/2005 | Mistretta | ............. | 324/307 |
| 7,358,730 B2* | 4/2008 | Mistretta et al. | ............. | 324/307 |
| 7,711,166 B2* | 5/2010 | Mistretta et al. | ............. | 382/128 |
| 7,917,189 B2* | 3/2011 | Mistretta | ............. | 600/410 |

\* cited by examiner

*Primary Examiner* — Dixomara Vargas
(74) *Attorney, Agent, or Firm* — Quarles & Brady, LLP

(57) ABSTRACT

A method for producing background-suppressed MR images with improved resistance to subject motion and noise, particularly that associated with parallel imaging techniques. An MRI system is employed to acquire two sets of undersampled k-space data under different scan conditions. A differential k-space data set is then formed by complex, pairwise subtraction of the two undersampled k-space data sets and a background-suppressed MR is reconstructed from the differential k-space data set using an accelerated reconstruction technique, such as GRAPPA.

18 Claims, 3 Drawing Sheets

PARALLEL-ACCELERATED COMPLEX SUBTRACTION MRI

BACKGROUND OF THE INVENTION

The field of the invention is magnetic resonance imaging ("MRI") methods and systems. More particularly, the invention relates to the suppression of unwanted background signal in accelerated MR imaging.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

In MRI systems, the excited spins induce an oscillating sine wave signal in a receiving coil. The frequency of this signal is near the Larmor frequency, and its initial amplitude, $A_0$, is determined by the magnitude of the transverse magnetic moment $M_t$. The amplitude, A, of the emitted NMR signal decays in an exponential fashion with time, t. The decay constant $1/T*2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor that contributes to the amplitude A of the NMR signal is referred to as the spin-lattice relaxation process that is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient (Gy) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel imaging". Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

Two categories of such parallel imaging techniques that have been developed and applied to in vivo imaging are SENSE (SENSitivity Encoding) and SMASH (SiMultaneous Acquisition of Spatial Harmonics). With SENSE, the undersampled k-space data is first Fourier transformed to produce an aliased image from each coil, and then the aliased image signals are unfolded by a linear transformation of the superimposed pixel values. With SMASH, the omitted k-space lines are filled in or reconstructed prior to Fourier transformation, by constructing a weighted combination of neighboring lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as GRAPPA (GeneRalized Autocalibrating Partially Parallel Acquisitions), introduced by Griswold et al. This technique is described in U.S. Pat. No. 6,841,998 as well as in the article titled "Generalized Autocalibrating Partially Parallel Acquisitions (GRAPPA)," by Griswold et al. and published in *Magnetic Resonance in Medicine* 47:1202-1210 (2002). Using these GRAPPA techniques, lines near the center of k-space are sampled at the Nyquist frequency (in comparison to the greater spaced lines at the edges of k-space). These so-called autocalibration signal (ACS) lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

It is often desirable to remove unwanted background signal from MR images to more clearly depict a tissue or structure of interest. In magnetic resonance angiography (MRA), for example, it is often desirable to remove venous and non-vascular signal in order to provide an unobstructed depiction of a subject's arteries. Background signal suppression typically involves subtracting two reconstructed MR images (in image space) acquired under different scan conditions so that background signal common to the two MR images is removed. However, unwanted differences between the two MR images, for example, due to subject motion and noise, can lead to significant subtraction artifacts that degrade diagnostic quality. In contrast-enhanced breast MRI, for example, subtraction artifacts occur routinely and can obscure small enhancing tumors and cause false positive diagnoses. Subtraction artifacts are particularly problematic when parallel imaging techniques are used to accelerate data acquisition, because of noise amplification relating to the geometry factor, or "g-factor," of the parallel imaging reconstruction process. The deleterious effect of "g-factor" noise increases with acceleration factor to the point where subtraction artifacts markedly limit the utility of background-suppression via image-space subtraction.

It would therefore be desirable to have an improved method for suppressing unwanted background signal in accelerated MR imaging, in which the prevalence and conspicuity of artifacts due to patient motion and "g-factor" noise is significantly reduced.

SUMMARY OF THE INVENTION

The present invention overcomes the aforementioned drawbacks by providing a method for producing background-suppressed MR images via complex subtraction of MR data sets in k-space. The method includes acquiring a first set of undersampled k-space data from the subject and acquiring a second set of undersampled k-space data from the subject. The method further includes subtracting the first set of undersampled k-space data from the second set of undersampled k-space data in order to produce a differential k-space data set that is substantially more sparse than the first and second sets of undersampled k-space data and reconstructing, from the differential k-space data and using a parallel image reconstruction method, an image of the subject in which background signal is substantially suppressed.

Various other features of the present invention will be made apparent from the following detailed description and the drawings.

DESCRIPTION OF THE PREFERRED EMBODIMENT

Figure 1:
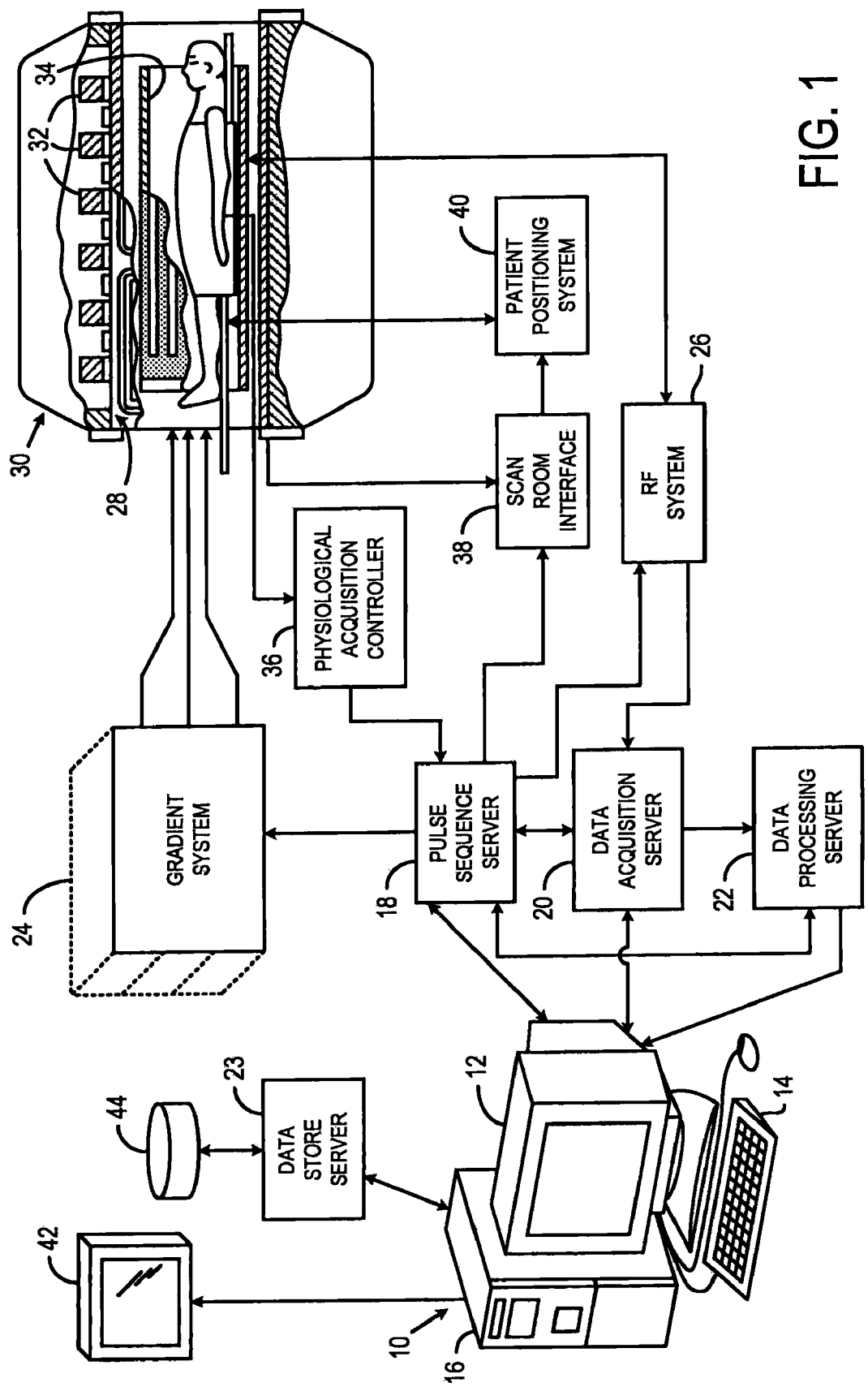
FIG. 1 is a block diagram of an MRI system that employs the present invention.

Referring to FIG. 1, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$, used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1} Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
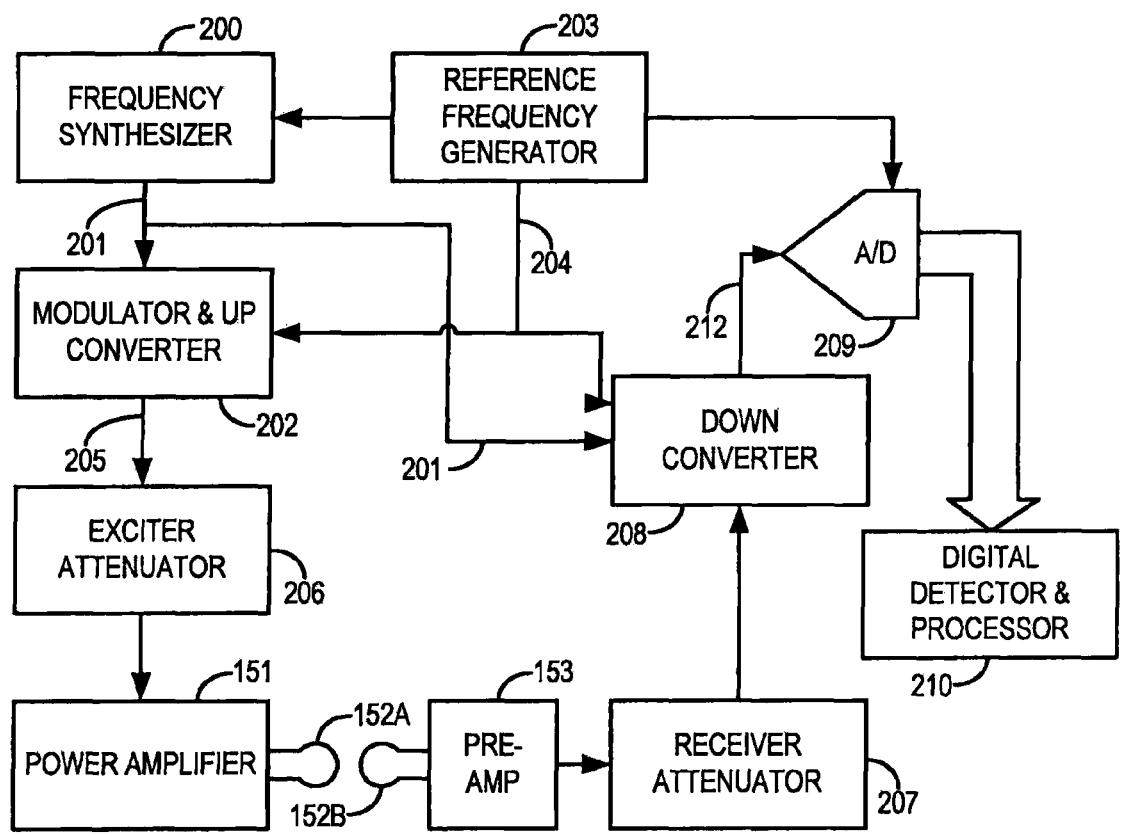
FIG. 2 is a block diagram of an RF system that forms part of the MRI system of FIG. 1.

As shown in FIG. 1, the RF system 26 may be connected to the whole body RF coil 34, or as shown in FIG. 2, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring still to FIG. 2 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the ND converter 209 are produced by a reference frequency generator 203.

Figure 3:
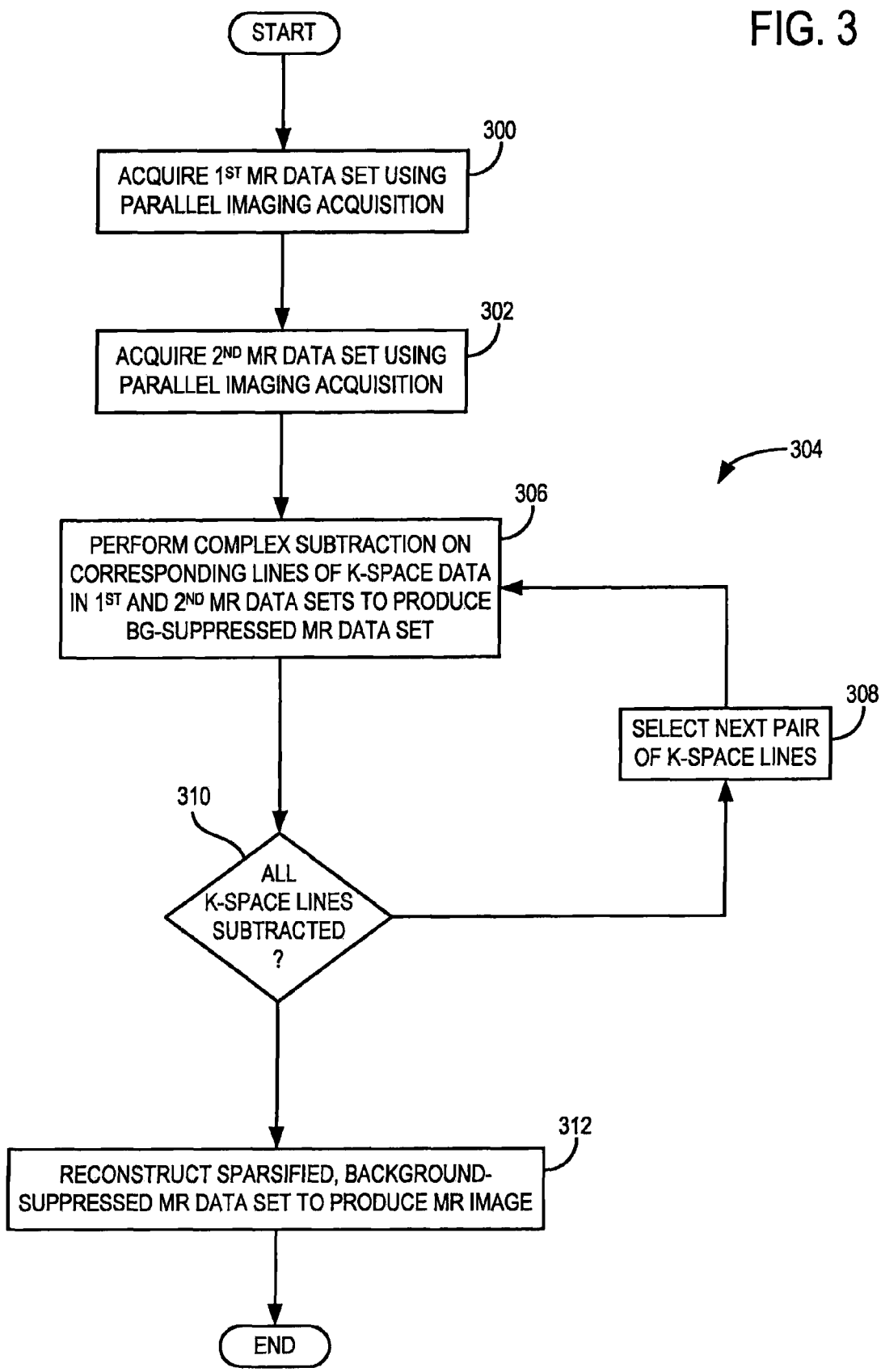
FIG. 3 is a flowchart setting forth steps for producing a background suppressed MR image in accordance with the present invention.

Referring to FIG. 3, the above-described MRI system can be employed in accordance with the present invention to produce background-suppressed MR images. A method for producing such background-suppressed MR images begins at process block 300 with the acquisition of a first set of undersampled MR, or k-space, data from a subject. At process block 302, a second set of undersampled MR, or k-space, data is acquired from the subject. A variety of pulse sequences can be employed for the acquisitions, for example, spoiled gradient echo, balanced steady-state free precession, inversion recovery-prepared gradient-echo, turbo spin-echo, and echo planar pulse sequences. Moreover, these pulse sequences can be configured to acquire k-space data by sampling k-space with Cartesian or non-Cartesian sampling patterns. Exemplary non-Cartesian sampling patterns include those that sample k-space as a series of radial projections extending from or through the center of k-space. However, to facilitate background suppression, the two acquisitions are performed under different scan conditions. For example, the first set of MR data may be acquired before the administration of a paramagnetic contrast agent such as gadolinium to the subject, while the second set of MR data may be acquired during or after contrast agent administration. In this case, the signal intensity of enhanced vascular structures would differ between the first and second MR data sets, while background tissue signal would be substantially equal. Likewise, the first set of MR data may be acquired during one phase of the cardiac cycle and the set MR data set during another cardiac phase. Thus, signal associated dynamic cardiac structures would differ between the first and second MR data sets, while signal associated with static background structures would be substantially equal. It is also contemplated that changes in scan conditions between acquisitions can also be induced using techniques such as spin-labeling.

As indicated generally at 304, following acquisition, a differential MR data set is formed via a complex, pairwise subtraction of the first and second MR data sets in k-space. Specifically, at process block 306, corresponding k-space lines of the first and second MR data sets are subtracted, via a complex subtraction, to produce a k-space line of the differential MR data set. At process block 308, the method proceeds to the next pair of corresponding k-space lines and an additional k-space line of differential MR data set is formed by subtraction at process block 308. This cycle continues until, at decision block 310, it is determined that all pairs of corresponding k-space lines have been subtracted and the differential MR data set is fully formed. Accordingly, signal common to the first and second MR data sets is substantially absent from the differential MR data set, while varying signal associated with the change in scan conditions is present. For example, a differential MR data set produced by subtracting the above-discussed pre- and post-contrast agent MR data sets would generally include signal associated with contrast-enhanced vascular structures, but would be substantially free of signal associated with non-enhanced background structures. At process block 312, the differential MR data is reconstructed to produce a background-suppressed MR image of the subject in which background signal is uniformly suppressed and target tissues appear conspicuous. It is contemplated that such background-suppressed MR images may be used for clinical applications such as a contrast-enhanced and non-contrast-enhanced MRA image and contrast-enhanced breast MRI. It should also be noted that image reconstruction should be performed using an accelerated reconstruction technique appropriate to the image acquisition used. Exemplary accelerated, or parallel image, reconstruction methods include those that operate in k-space, including SMASH, AUTO-SMASH, GRAPPA, PARS, and the like.

Because subtraction is performed in k-space, rather than image space, the background-suppressed MR image generally has fewer and less conspicuous artifacts than background-suppressed images formed using traditional image-space subtraction techniques. This occurs for a number of reasons: First, signal at a given location in k-space maps to all locations of image space. By subtracting the first and second MR data sets in k-space, differences in noise distribution between the two data sets are distributed over the entire background-suppressed MR image during reconstruction. Because the noise signal is spread over the entire image, the prevalence and conspicuity of highly-obstructive noise artifacts at isolated spatial locations is greatly reduced. This is especially beneficial for maintaining image quality in accelerated, background suppressed MRI studies where "g-factor" noise associated with the parallel acquisitions can have a significantly different distribution between the first and second MR data sets, particularly at higher parallel acceleration rates. The approach is also less sensitive to patient motion, since unwanted differences between the first and second MR data sets due patient motion are distributed over image space and are less prone to forming visually-conspicuous, spatially-isolated motion artifacts. Second, the subtraction data in the differential MR data set is routinely more sparse, that is, holds less information, than the data contained in the individual, source data sets. The improved sparsity of the subtracted data reduces ill-conditioning of the inverse problems typically solved by accelerated reconstruction techniques such as GRAPPA and SENSE.

Parallel imaging techniques that are performed in k-space, such as GRAPPA, are further benefitted by the method of the present invention. For example, parallel reconstruction methods such as GRAPPA operate by calculating a plurality of weighting factors from acquired k-space data. More particularly, the k-space data used by GRAPPA in these calculations are so-called autocalibration signal ("ACS") lines acquired in addition to the other k-space data in the acquired sets of undersampled k-space data. These weighting factors are employed to synthesize additional lines of k-space data such that, when combined with the original undersampled k-space data set, a substantially fully sampled k-space data set is produced. When practicing the present invention using parallel reconstruction methods such as GRAPPA, "differential" ACS lines are produced by the subtraction of the ACS lines in the first MR, or k-space, data set from those corresponding ACS lines in the second MR, or k-space, data set. Additional lines of differential k-space data are then synthesized from weighting factors that are calculated from these differential ACS lines. In this manner, signals corresponding to background tissues are substantially suppressed in the additional lines of k-space data produced. By synthesizing additional differential k-space lines in this manner, a more accurate suppression of background signals is allowed than is achievable by performing the subtraction of two images produced with these parallel reconstruction methods.

It should be noted that the present invention is not limited to one-to-one pairwise subtractions of k-space lines. For instance, a weighting factor can be applied to selected k-space lines prior to subtraction to adjust the extent to which background suppression is performed. Standard image processing techniques can also be used to improve image quality, but with reduced misregistration artifacts and improved background tissue suppression compared to traditional methods. In addition, the present invention also applies to situations where a mismatch of k-space data along a particular phase-encoding direction is created deliberately. For example, when even-numbered phase-encoding k-space data are acquired before the administration of a paramagnetic contrast agent such as gadolinium to the subject, and the remaining phase-encoding k-space data are acquired during or after contrast agent administration, the inconsistency within the acquired k-space data will produce a replica, or "ghost", of the structures associated with the inconsistency contained within the acquired k-space data. The ghost signal, if positioned in the vicinity of volume elements containing low signal intensity, can provide improved background suppression similar to that described above in the case of complex subtraction. Additional steps can be taken to enhance the conspicuity of such ghost artifacts, such as the application of filters that exploit the periodicity of ghost artifacts and the use of maximum intensity projections and summation techniques. "Ghost MRI" methods are further described in U.S. patent application Ser. No. 12/509,180, which is incorporated herein by reference.

The present invention has been described in terms of the preferred embodiment, and it should be appreciated that many equivalents, alternatives, variations, and modifications, aside from those expressly stated, are possible and within the scope of the invention. Therefore, the invention should not be limited to a particular described embodiment.

The invention claimed is:

1. A method for producing an image of a subject with a magnetic resonance imaging (MRI) system, the steps comprising:
   a) acquiring, using the MRI system, a first set of undersampled k-space data from the subject;
   b) acquiring, using the MRI system, a second set of undersampled k-space data from the subject;
   c) subtracting the first set of undersampled k-space data from the second set of undersampled k-space data in order to produce a differential k-space data set that is substantially more sparse than the first and second sets of undersampled k-space data; and
   d) reconstructing, from the differential k-space data and using a parallel image reconstruction method, an image of the subject in which background signal is substantially suppressed.

2. The method as recited in claim 1 in which the first and second sets of undersampled k-space data are acquired in steps a) and b), respectively, using at least one of a Cartesian and non-Cartesian sampling pattern.

3. The method as recited in claim 2 in which step c) includes subtracting lines of k-space data in the first set of undersampled k-space data from corresponding lines of k-space data in the second set of undersampled k-space data.

4. The method as recited in claim 3 in which step c) includes weighting at least one of the lines of k-space data from at least one of the first and second set of undersampled k-space data prior to performing the subtraction.

5. The method as recited in claim 1 in which step d) includes performing a parallel image reconstruction in k-space.

6. The method as recited in claim 5 in which step d) includes:
   i) calculating at least one weighting factor from the differential k-space data set;
   ii) producing at least one synthesized line of differential k-space data using the at least one calculated weighting factor;
   iii) combining the produced differential k-space data set and the produced at least one synthesized line of differential k-space data in order to produce a combined differential k-space data set; and
   iv) reconstructing the image of the subject from the combined differential k-space data set.

7. The method as recited in claim 5 in which the first and second sets of undersampled k-space data acquired in steps a) and b), respectively, include at least one autocalibration signal (ACS) line of k-space data.

8. The method as recited in claim 7 in which the differential k-space data set produced in step c) includes at least one differential ACS line of k-space data produced by subtracting the at least one ACS line of k-space data from the first set of undersampled k-space data from the at least one ACS line of k-space data from the second set of undersampled k-space data.

9. The method as recited in claim 8 in which step d) includes:
   i) calculating at least one weighting factor from the at least one differential ACS line of k-space data;
   ii) producing at least one synthesized line of differential k-space data using the at least one calculated weighting factor;
   iii) combining the produced differential k-space data set and the produced at least one synthesized line of differential k-space data in order to produce a combined differential k-space data set; and
   iv) reconstructing the image of the subject from the combined differential k-space data set.

10. The method as recited in claim 8 in which step d) includes:
    i) calculating at least one weighting factor from the at least one differential ACS line of k-space data;
    ii) producing at least one synthesized line of differential k-space data using the at least one calculated weighting factor;
    iii) combining the produced differential k-space data set and the produced at least one synthesized line of differential k-space data in order to produce a combined differential k-space data set; and
    iv) reconstructing the image of the subject from the combined differential k-space data set.

11. A magnetic resonance imaging (MRI) system, comprising:
    a magnet system configured to generate a polarizing magnetic field about at least a portion of a subject arranged in the MRI system;
    a magnetic gradient system including a plurality of magnetic gradient coils configured to apply at least one magnetic gradient field to the polarizing magnetic field;
    a radio frequency (RF) system configured to apply an RF field to the subject and to receive magnetic resonance signals therefrom in parallel;
    a non-transitory computer system programmed to carry out the steps of:
    a) acquiring a first set of undersampled k-space data from the subject;
    b) acquiring a second set of undersampled k-space data from the subject;
    c) subtracting the first set of undersampled k-space data from the second set of undersampled k-space data in order to produce a differential k-space data set that is substantially more sparse than the first and second sets of undersampled k-space data; and
    d) reconstructing, from the differential k-space data and using a parallel image reconstruction method, an image of the subject in which background signal is substantially suppressed.

12. The system as recited in claim 11 in which the first and second sets of undersampled k-space data are acquired in steps a) and b), respectively, using at least one of a Cartesian and non-Cartesian sampling pattern.

13. The system as recited in claim 12 in which step c) includes subtracting lines of k-space data in the first set of undersampled k-space data from corresponding lines of k-space data in the second set of undersampled k-space data.

14. The system as recited in claim 13 in which step c) includes weighting at least one of the lines of k-space data from at least one of the first and second set of undersampled k-space data prior to performing the subtraction.

15. The system as recited in claim 11 in which step d) includes performing a parallel image reconstruction in k-space.

16. The system as recited in claim 15 in which step d) includes:

i) calculating at least one weighting factor from the differential k-space data set;

ii) producing at least one synthesized line of differential k-space data using the at least one calculated weighting factor;

iii) combining the produced differential k-space data set and the produced at least one synthesized line of differential k-space data in order to produce a combined differential k-space data set; and iv) reconstructing the image of the subject from the combined differential k-space data set.

17. The system as recited in claim 15 in which the first and second sets of undersampled k-space data acquired in steps a) and b), respectively, include at least one autocalibration signal (ACS) line of k-space data.

18. The system as recited in claim 17 in which the differential k-space data set produced in step c) includes at least one differential ACS line of k-space data produced by subtracting the at least one ACS line of k-space data from the first set of undersampled k-space data from the at least one ACS line of k-space data from the second set of undersampled k-space data.

* * * * *

UNITED STATES PATENT AND TRADEMARK OFFICE
CERTIFICATE OF CORRECTION

| | | |
|---|---|---|
| PATENT NO. | : 8,274,284 B2 | Page 1 of 1 |
| APPLICATION NO. | : 12/574497 | |
| DATED | : September 25, 2012 | |
| INVENTOR(S) | : Robert R. Edelman and Ioannis Koktzoglou | |

It is certified that error appears in the above-identified patent and that said Letters Patent is hereby corrected as shown below:

On the face page, line 75 "Ioannia" should be -- Ioannis --

Signed and Sealed this

Fourth Day of December, 2012

David J. Kappos
*Director of the United States Patent and Trademark Office*